United States Patent
Tashiro

[11] Patent Number: 5,952,684
[45] Date of Patent: Sep. 14, 1999

[54] CHIP LAYOUT OF SEMICONDUCTOR INTEGRATED CIRCUIT

[75] Inventor: Masahisa Tashiro, Tokyo, Japan

[73] Assignee: OKI Electric Industry Co., Ltd., Tokyo, Japan

[21] Appl. No.: 08/976,604

[22] Filed: Nov. 24, 1997

[30] Foreign Application Priority Data

Feb. 18, 1997 [JP] Japan ................................. 9-033858

[51] Int. Cl.⁶ ................................................ H01L 27/118
[52] U.S. Cl. ............................ 257/207; 257/672; 257/723
[58] Field of Search ................................. 257/672, 723, 257/777, 207, 210

[56] References Cited

U.S. PATENT DOCUMENTS

| | | | |
|---|---|---|---|
| 5,315,182 | 5/1994 | Sakashita et al. | 257/207 |
| 5,319,243 | 6/1994 | Leicht et al. | 257/701 |
| 5,488,256 | 1/1996 | Tsunoda | 257/691 |
| 5,654,590 | 8/1997 | Kuramochi | 257/723 |
| 5,726,500 | 3/1998 | Duboz et al. | 257/777 |
| 5,828,108 | 10/1998 | Toyoda | 257/207 |

*Primary Examiner*—David B. Hardy
*Attorney, Agent, or Firm*—Rabin & Champagne, P.C.

[57] ABSTRACT

A chip layout of a semiconductor integrated circuit, includes a plurality of device patterns that are designed to form a semiconductor substrate having a single power supply; and a metal wiring pattern, which is to be formed on the semiconductor substrate. The metal wiring pattern is divided into plural parts to provide a plurality of power-supply channels.

9 Claims, 9 Drawing Sheets

CHIP LAYOUT OF SEMICONDUCTOR INTEGRATED CIRCUIT

CROSS REFERENCE TO RELATED APPLICATION

This application claims the priority of Application No. H09-033858, filed Feb. 18, 1997 in Japan, the subject matter of which is incorporated herein by reference.

TECHNICAL FIELD OF THE INVENTION

The present invention relates to a chip layout of a semiconductor integrated circuit having an improved noise reduction structure and a method for verifying the same.

BACKGROUND OF THE INVENTION

In general, fabrication of a semiconductor integrated circuit begins with a definition of a specific function and circuit design to accomplish the function. Such a circuit design process includes a circuit layout (chip layout) step, which is performed with sophisticated computer-aided design (CAD) systems.

In a semiconductor integrated circuit, a power signal may be changed in level due to noise omitted by other circuits. A circuit that operates with a lower level of voltage, such as a differentially-operating type of circuit, may be substantially affected by the noise and have some errors. For reducing the affect of the noise, in a conventional chip layout, a plurality of power supplies are employed to realize a multi-power-supply structure, or a capacitance pattern is inserted in the layout of the integrated circuit. The conventional chip layout is logically verified using a four-terminal transistor model to check connection of all the nodes.

According to the conventional chip layout, for realizing the multi-power-supply structure, a semiconductor substrate and a metal wiring pattern are each required to be divided. Otherwise, a capacitance pattern is required to be inserted in the chip layout. Therefore, the conventional chip layout is not applicable to an LSI chip with a pre-formed mask pattern, such as a gate-array. When the capacitance pattern is inserted in the chip layout, the area of the chip becomes larger. Further, in a process for making a mask pattern, it is required to generate information indicating that a part of the circuit is provided with an extra power supply. And, it is required that an operator carry out additional work.

According to the conventional method for verifying the chip layout, it is impossible to detect an error in which a signal node is connected to an unconnected semiconductor substrate, provided with no power supply. In addition, it takes a long time to detect a location where a short circuit is made among a plurality of signal nodes.

OBJECTS OF THE INVENTION

Accordingly, an object of the invention is to provide a chip layout of a semiconductor integrated circuit, which easily decreases an affect of external noise, without requiring either division of a power supply in a semiconductor substrate or insertion of a capacitance pattern.

Another object of the invention is to provide a method for verifying a chip layout, which can detect an error in which a signal node is connected to an unconnected semiconductor substrate, and can easily detect a location where a short circuit is made among a plurality of signal nodes.

A further object of the invention is to provide a semiconductor integrated circuit that is fabricated in accordance with a chip layout, which easily decreases an affect of external noise without dividing a power supply in a semiconductor substrate nor inserting a capacitance pattern.

Additional objects, advantages and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the invention, a chip layout of a semiconductor integrated circuit includes, a plurality of device patterns that are designed to form a semiconductor substrate having a single power supply; and a metal wiring pattern, which is to be formed on the semiconductor substrate. The metal wiring pattern is divided into plural parts to provide a plurality of power-supply channels.

According to a second aspect of the invention, a method for verifying a chip layout of a semiconductor integrated circuit, which is fabricated in accordance with a layout including a plurality of device patterns for a semiconductor substrate and a metal wiring pattern, includes the steps of: verifying connection of the metal wiring pattern using a three-terminal transistor model; and verifying connection of the device patterns.

According to a third aspect of the invention, a semiconductor integrated circuit is formed in accordance with a predetermined chip layout, wherein the chip layout includes a plurality of device patterns that are designed to form a semiconductor substrate having a single power supply, and a metal wiring pattern, which is to be formed on the semiconductor substrate. The metal wiring pattern is divided into plural parts to provide a plurality of power-supply channels.

DETAILED DISCLOSURE OF THE INVENTION

Figure 1:
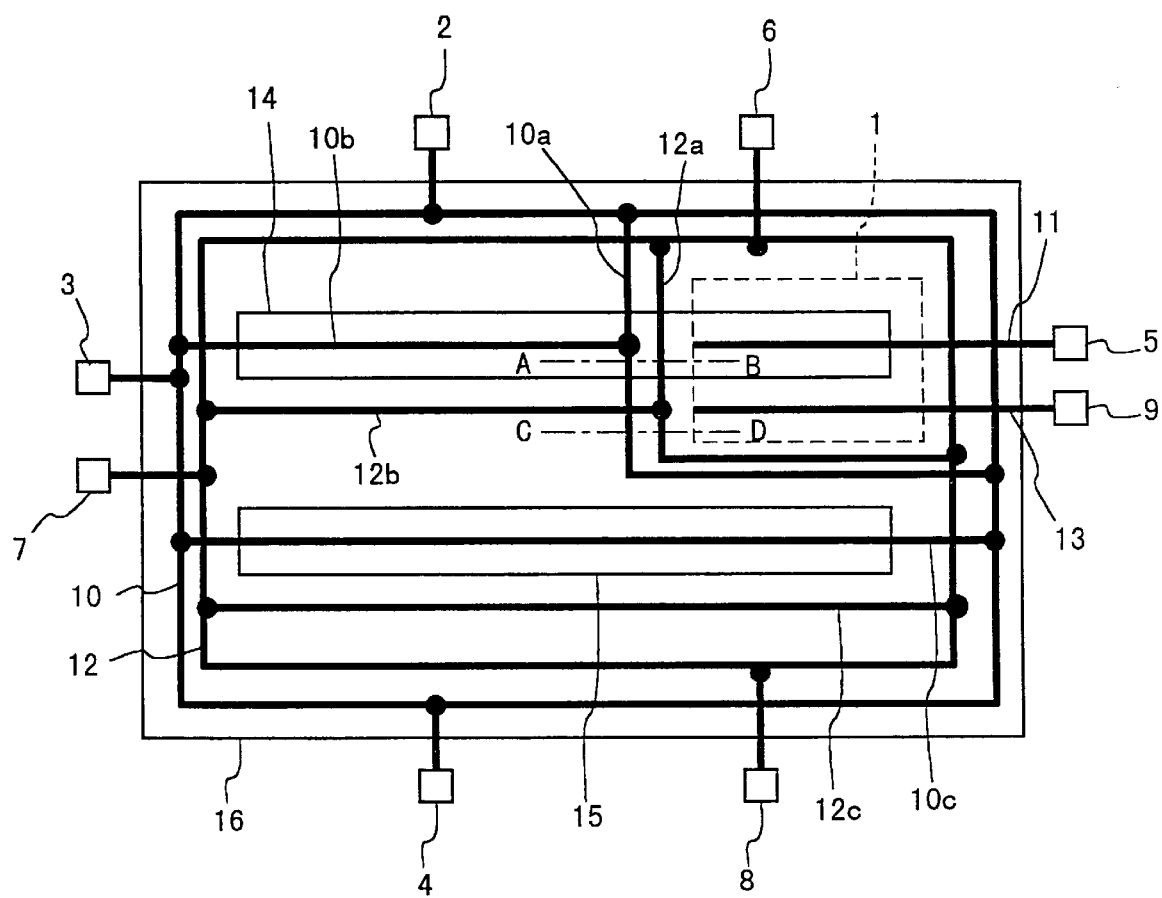
FIG. 1 is a plan view illustrating a chip layout of a semiconductor integrated circuit, according to a first preferred embodiment of the invention.

FIG. 1 shows a chip layout of a semiconductor integrated circuit, according to a first preferred embodiment of the invention. Each of FIGS. 2 to 5 shows the inner structure of the semiconductor integrated circuit, fabricated in accordance with the chip layout shown in FIG. 1. The cross section taken on line A-B of FIG. 1 can be shown as either FIG. 2 or FIG. 3. The cross section taken on line C-D of FIG. 1 can be shown as either FIG. 4 or FIG. 5.

The semiconductor integrated circuit includes a P⁻ type semiconductor substrate 16, N⁻ type semiconductor substrates 14 and 15 formed on the P⁻ type semiconductor substrate 16, and a metal wiring layer (pattern) 10 to 13. The metal wiring layer (pattern) includes VDD wires 10 and 11 GND wires 12 and 13. The VDD wire 10 is designed to be square and surround most cells of the integrated circuit. The VDD wire 10 is connected to other VDD wires 10a, 10b, 10c and 10d. The GND wire 12 is designed to be square and disposed just inside the VDD wire 10, and is connected to other GND wires 12a, 12b, 12c and 12d.

The VDD wire 10 is also connected to VDD bonding pads 2 to 4, and the GND wire 12 is also connected to GND bonding pads 6 to 8. The VDD wire 11 is connected to none of the other VDD wires 10, 10a, 10 b, 10c and 10d, but is connected to a VDD pad 5. The GND wire 13 is connected to none of the other GND wires 12, 12a, 12b, 12c and 12d, but is connected to a GND pad 9. A reference number 1 indicates an area where a multi-channel power supply circuit is formed.

Figure 2:
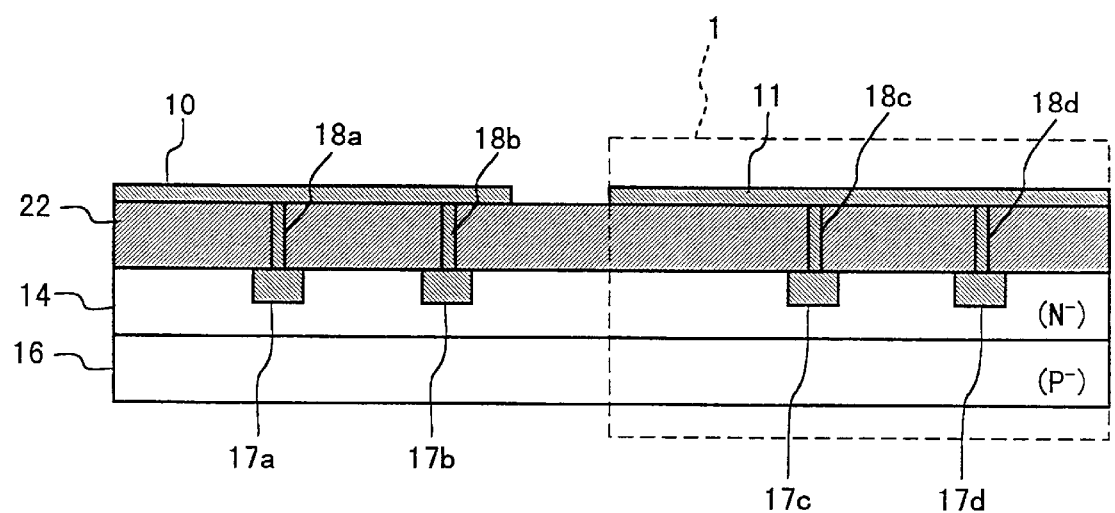
FIG. 2 is a cross-sectional view taken on line A-B of FIG. 1.
Figure 3:
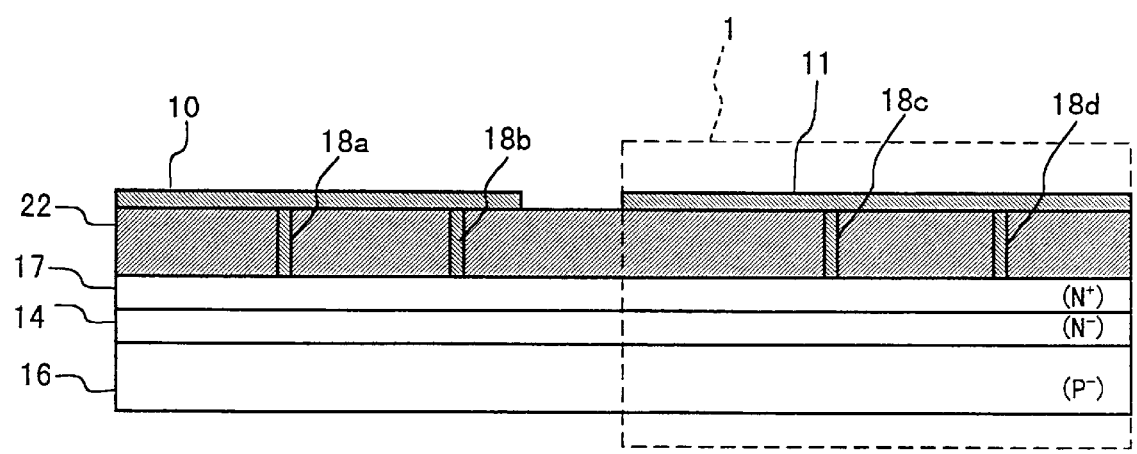
FIG. 3 is another cross-sectional view taken on line A-B of FIG.

Referring to FIGS. 2 to 5, the semiconductor integrated circuit further includes N⁺ type diffusion regions 17a, 17b, 17c and 17d, shown in FIG. 2, or an N⁺ type diffusion layer 17, shown in FIG. 3, each connected to the N$^{n-}$ type semiconductor substrate 14. The N⁺ type diffusion regions 17a, 17b, 17c and 17d and N⁺ type diffusion layer 17 are connected to the VDD wires 10 and 11 through contacts 18a, 18b, 18c and 18d. The contacts 18a, 18b, 18c and 18d are formed in an insulating layer 22.

Figure 4:
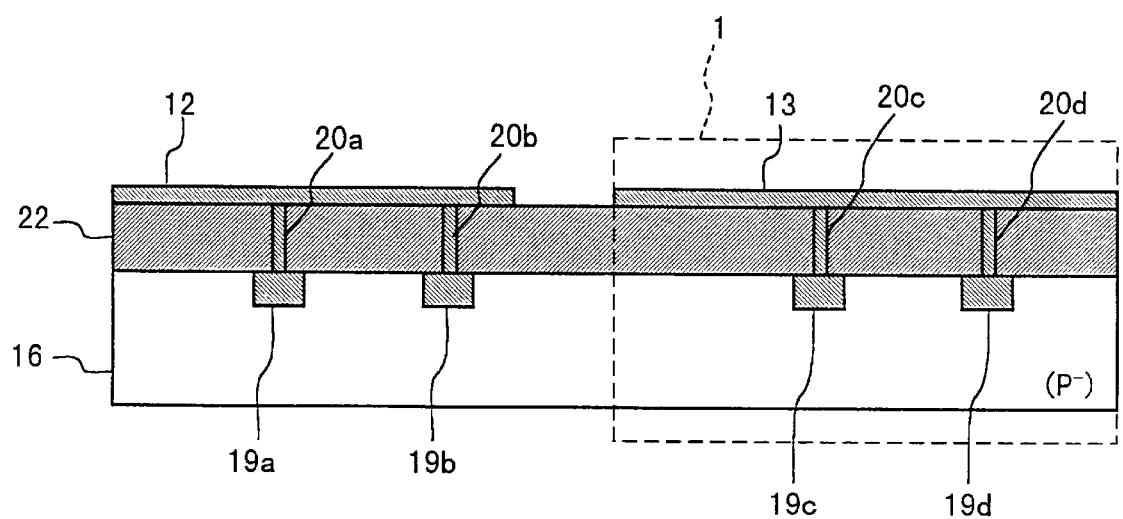
FIG. 4 is a cross-sectional view taken on line C-D of FIG. 1.
Figure 5:
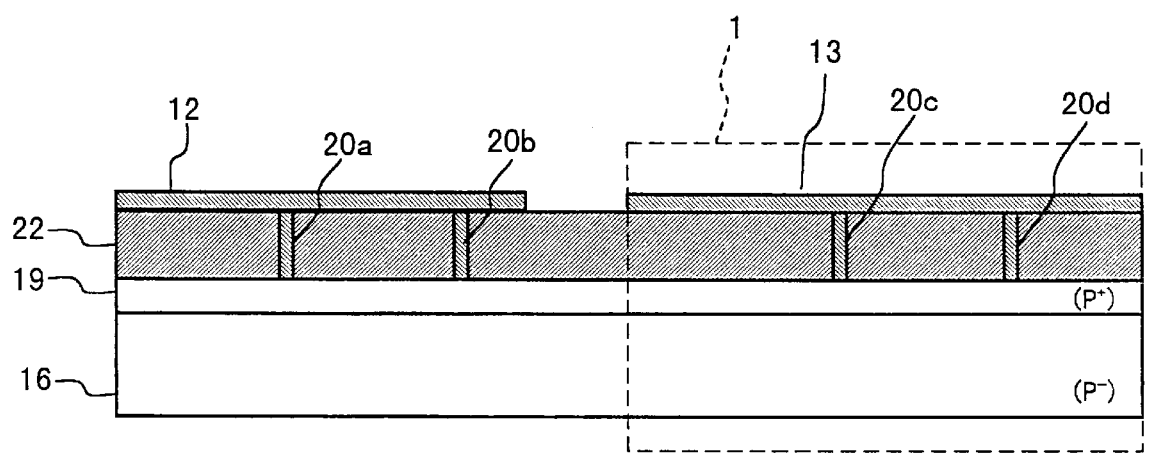
FIG. 5 is another cross-sectional view taken on line C-D of FIG. 1.

The semiconductor integrated circuit further includes P⁺ type diffusion regions 19a, 19b, 19c and 19d, shown in FIG. 4, or a P⁺ type diffusion layer 19, shown in FIG. 5, each connected to the P⁻ type semiconductor substrate 16. The P⁺ type diffusion regions 19a, 19b, 19c and 19d and P⁺ type diffusion layer 19 are connected to the GND wires 12 and 13 through contacts 20a, 20b, 20c and 20d. The contacts 20a, 20b, 20c and 20d are formed in the insulating layer 22. As can be understood from FIGS. 2 to 5, resistance is formed between the contacts 18a, 18b, 18c and 18d, and 20a, 20b, 20c and 20d.

In the above described chip layout, the wiring pattern is divided into two pairs of 11 and the others (10, 10a, 10b, 10c and 10d) at the same voltage level to provide a plurality of power supply channels, which can be called a "multi-channel power supply." On the other hand, the semiconductor substrates 14 to 16 are designed to have a single power supply (not shown).

According to the chip layout of the embodiment, an affect of external noise can be easily decreased without dividing the power supply formed in the semiconductor substrates 14 to 16 nor inserting a capacitance pattern. Therefore, the chip layout is applicable to an LSI chip with a pre-formed mask pattern, such as a gate-array, without enlarging the area of the chip. Further, the chip layout includes the area 1 that indicates the existence of an extra power supply, so that it is not required to generate additional information indicating that a part of the circuit needs an extra power supply. As a result, the chip layout can be designed automatically.

Figure 6:
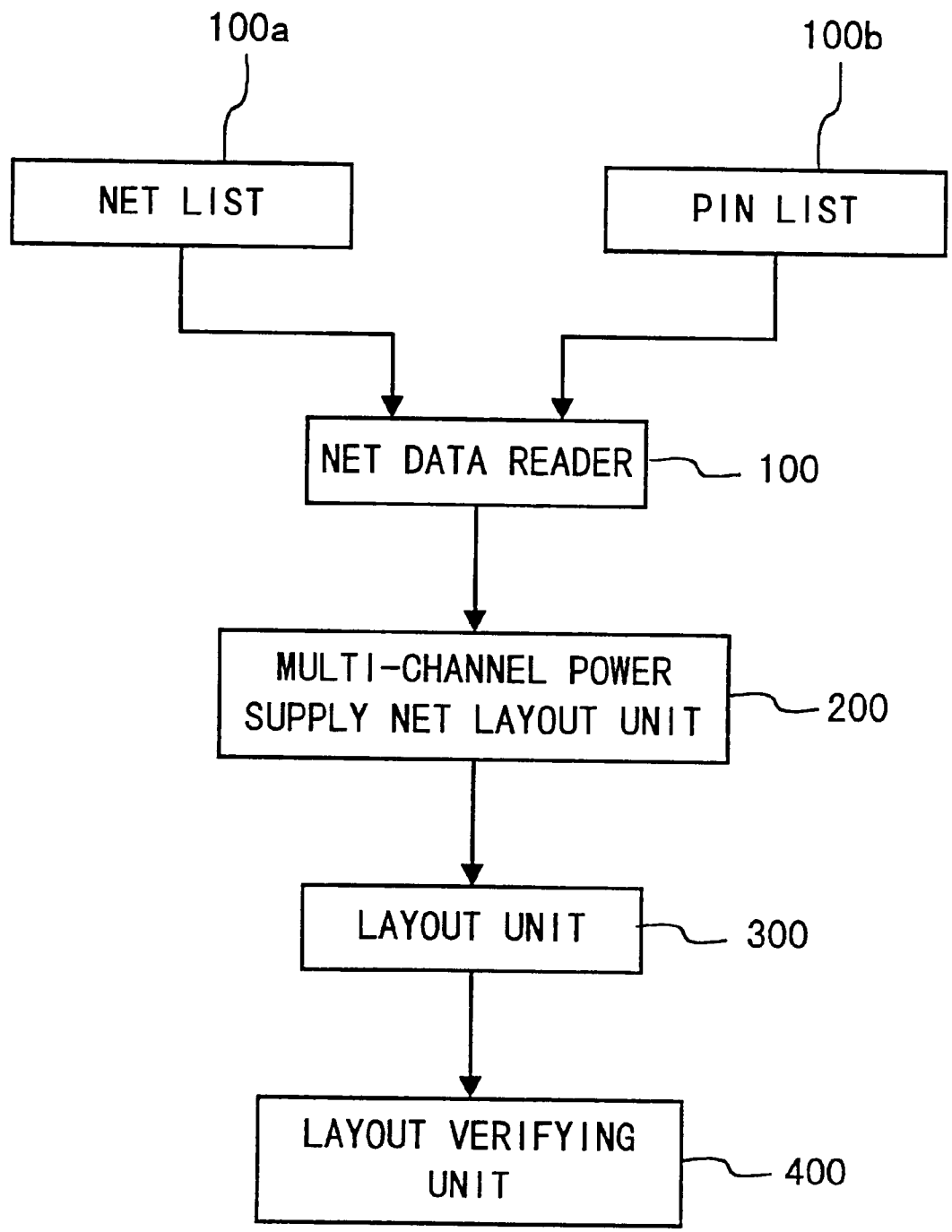
FIG. 6 is a block diagram showing a design support system of the semiconductor integrated circuit.
Figure 7:
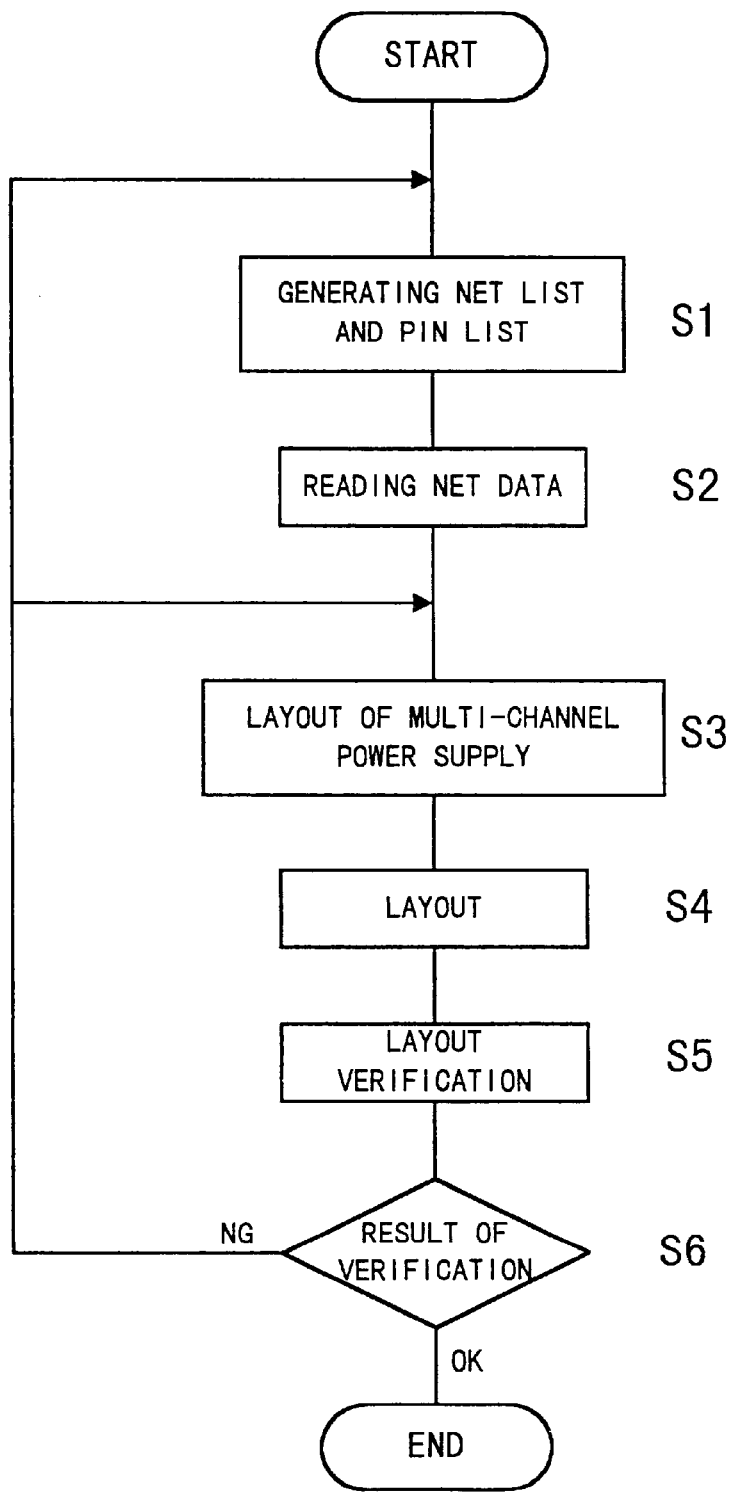
FIG. 7 is a flow chart showing the operation of chip design.

FIG. 6 shows a design support system for a semiconductor integrated circuit, and FIG. 7 shows the design operation of a semiconductor integrated circuit performed with the support system shown in FIG. 6. Now, a CAD system of a gate array with a net list, having no net data of power supply, is described. If the net list includes net data of a power supply, a pin list can be omitted.

The design support system includes a net data reader 100, a multi-channel power supply net layout unit 200, a general layout unit 300 and a layout verifying unit 400. The net data reader 100 generates net list information in accordance with a net list 100a and a pin list 100b. The multi-channel power supply net layout unit 200 produces a layout of a power supply net in accordance with the net list information supplied from the net data reader 100. The layout unit 300 performs an automatic layout of a core cell and an automatic layout of general signal patterns. The layout verifying unit 400 performs a logic verification of the layout.

In operation, the net list 100a and pin list 100b, which are to be inputted to the design support system, are generated at step S1. The net list 100a includes information regarding cells of, which composes the circuit is composed and connection data (net information) of the cells. The pin list 100b includes power supply cell information and information regarding the IO cell arrangement. At step S2, the net data reader 100 reads the net information from the net list 100a and pin list 100b.

The pin list 100b includes a group information input field, indicating power supply information. For requesting an extra power supply (multi-power-supply channel), information regarding the extra power supply is written in the group information input field as group information, so that the design support system can recognize that the extra power supply is requested.

When the group information, requesting the extra power supply (multi-power-supply channel), is written in the group information input field, the net data reader 100 picks up an IO cell the corresponding group information of which is existing in the information input field. The IO cell is determined from the pin list 100b. The found IO cell is not a power supply. The net data reader 200 generates net data of the extra power supply for the power supply cell, the group information of which is requested, and for a macro cell that is required to be applied with the extra power supply from an external IO terminal in the IO cell.

On the other hand, when no extra power supply is written in the group information input field, the net data reader 100 generates net data to have a general power supply. If the macro cell and IO cell can not be defined, or a core cell to which the extra power supply is applied can not be defined because of too many core cells, the multi-channel power supply layout unit 200 generates the information and locations of the undefined cells. The information and locations of the extra power supply can be inputted in the multi-channel power supply layout unit 200 in a floor plan process.

At step S3, the VDD wire 10 and the GND wire 12 are arranged between the IO cells (bonding pads) 2 to 9 and the area for cells, in no consideration of the area 1 for the extra power supply. Next, when the cells of the extra power supply are only macro cells, the location of the extra power supply is read from a floor plan information, or the multi-channel power supply layout unit 200 decides the location. When the cells of the extra power supply are composed of a core cell group, the location of the extra power supply is read from the floor plan information, or the multi-channel power supply layout unit 200 decides the location.

After the multi-channel power supply layout unit 200 reads the outer shape of the macro cell or the information from the floor plan, the multi-channel power supply layout unit 200 arranges the general power supply wires (10*a* and 12*a*) to surround the outer shape of the macro cell.

After that, mask data of the LSI chip is generated in the same manner as the conventional scheme. The layout unit 300 completes the chip layout and the information used for generating the chip layout is stored in a predetermined database. Then, the layout unit 300 generates a net list for layout verification in accordance with the information stored in the database.

At step S5, the layout verification unit 400 checks all the wires whether connected or disconnected. The layout verification is carried out with first and second verification steps. In the first verification step, a general verification is carried out using a three terminal transistor model. In other words, the layout verification unit 400 checks the connection between transistors composing each device and the metal wiring layer (10, 11 . . . ).

In the second verification step, the layout verification unit 400 checks a logic connection of the semiconductor substrates 14 to 16. In this verification, the layout verification unit 400 first finds the location of a mask pattern (18*a*, 18*b*, 18*c*, 18*d* . . . ) connecting the metal wiring layer (10, 11 . . . ) and the semiconductor substrates 14 to 16. Then, the layout verification unit 400 performs logic verification of the semiconductor substrates 14 to 16 in accordance with signal information taken from the metal wiring layer (10, 11 . . . ).

According to the above-described verification, including the first and second verification steps, it can be detected that wires other than the power supply wires are connecting to the semiconductor substrates 14 to 16. In other words, when node information of the metal wiring layer (10, 11 . . . ) is not VDD/GND, it can be detected that an unconnected independent semiconductor substrate, not to be applied with a power supply, is connected with a general wire. It may happen that a semiconductor substrate is supplied with no node information. It can be detected that such as semiconductor substrate is connected to a plurality of signals and the locations thereof.

At step S6, if the result of the above mentioned verification is successful, all the processes are terminated. On the other hand, if the result of the above mentioned verification is NG, the process is going back to steps S1 and S3.

According to the method for verifying a chip layout, an error in which a signal node is connected to an unconnected semiconductor substrate can be easily detected. In addition, a location where a short circuit is made among a plurality of signal nodes can be detected easily.

Figure 8:
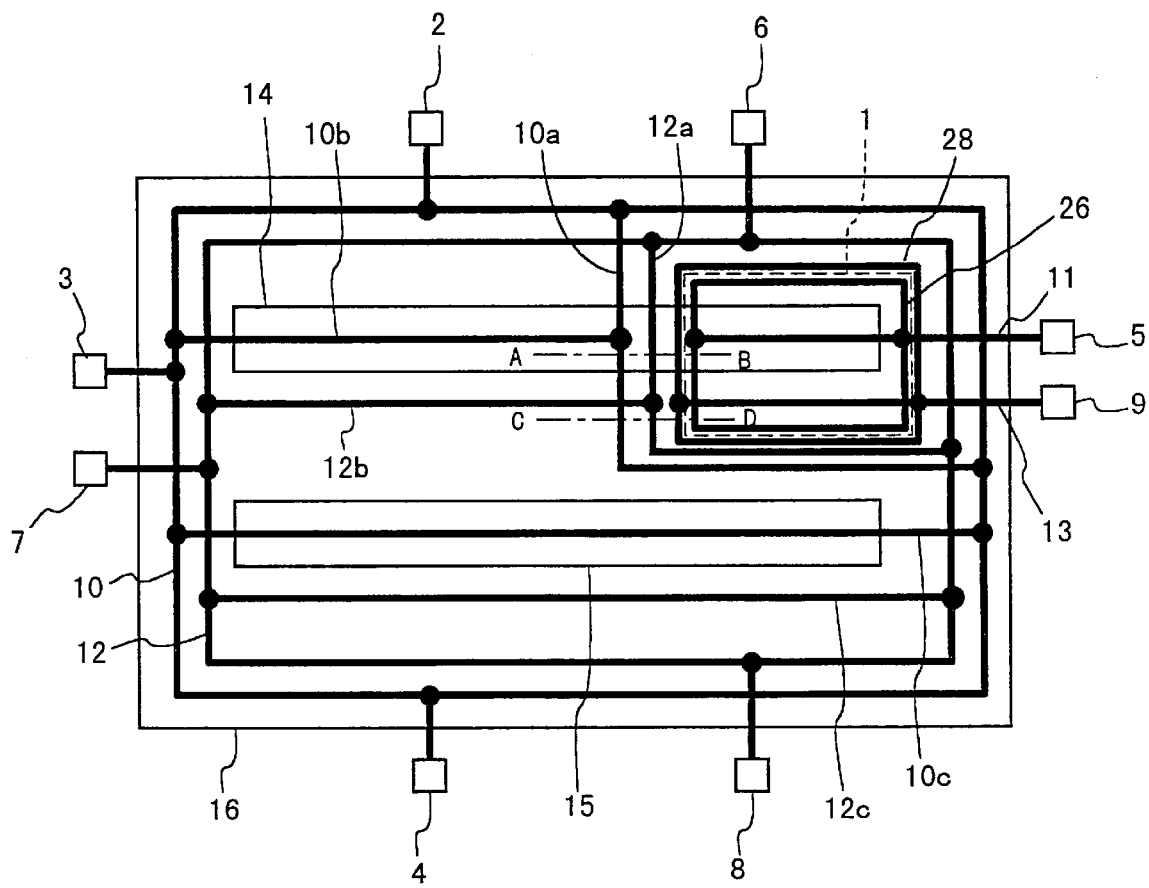
FIG. 8 is a plan view illustrating a chip layout of a semiconductor integrated circuit, according to a second preferred embodiment of the invention.

FIG. 8 shows a chip layout of a semiconductor integrated circuit, according to a second preferred embodiment of the invention. The most components of the embodiment are the same as those in the first preferred embodiment, shown in FIG. 1. Therefore, the same or corresponding components are indicated by the same reference numbers, and the same description is not repeated in order to avoid redundant description. The chip layout shown in FIG. 8 is useful when a large number of cells are formed in the area 1. The chip layout includes a VDD wire 26 connected to the VDD wire 11, and a GND wire 28 connected to the GND wire 13. Each of the VDD wire 26 and GND wire 28 is designed to be ring-shape surrounding the area 1.

Figure 9:
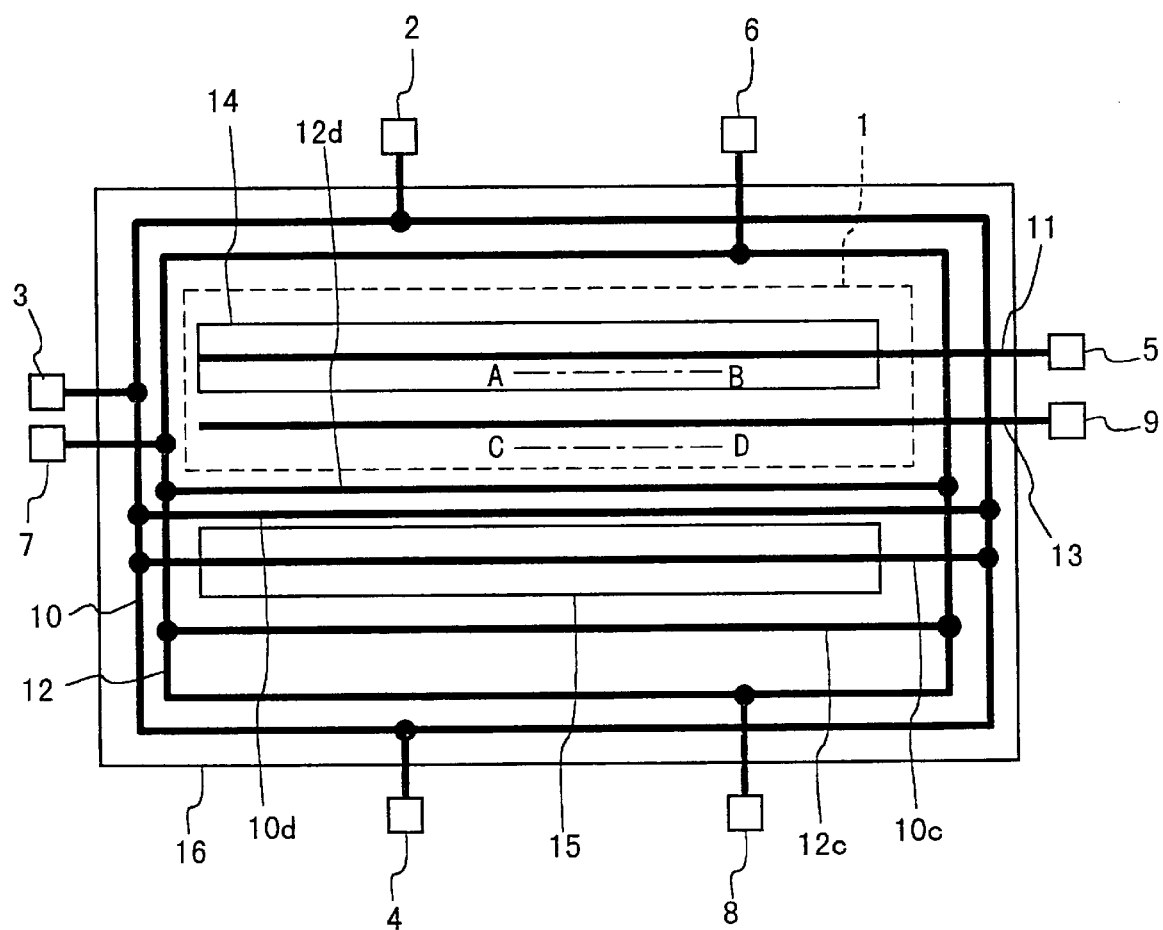
FIG. 9 is a plan view illustrating a chip layout of a semiconductor integrated circuit, according to a third preferred embodiment of the invention.

FIG. 9 shows a chip layout of a semiconductor integrated circuit, according to a third preferred embodiment of the invention. Most of the components of this embodiment are the same as those in the first and second preferred embodiments, shown in FIGS. 1 and 8. Therefore, the same or corresponding components are indicated by the same reference numbers, and the same description is not repeated for the sake of avoiding redundant description. In FIG. 9, the area 1 extends to cover the semiconductor substrate 14 entirely, so that devices formed in the semiconductor substrate 14 are completely apart from the other part of the integrated circuit. This structure is useful for an integrated circuit in which electrical power is sometimes supplied to only a part thereof, such as in a power saving mode.

It will be understood that the above description of the present invention is susceptible to various modifications, changes and adaptations, and the same are intended to be comprehended with the meaning and range of equivalents of the appended claims. For example, types of the semiconductor substrates 14 and 16 do not limit the function and characteristics thereof.

What is claimed is:

1. A chip layout of an integrated circuit on a semiconductor substrate, comprising:

a plurality of circuit blocks, including first and second circuit blocks, provided on the semiconductor substrate;

a plurality of power supply pads, including first and second power supply pads;

a plurality of ground pads, including first and second ground pads;

a plurality of power supply wires, including a first power supply wire and a second power supply wire, the first power supply wire being formed on the first circuit block and connected to the first power supply pad, the second power supply wire being formed on the second circuit block and connected to the second power supply pad, wherein the second power supply wire is not electrically connected to any other of the power supply wires of the layout; and a plurality of ground wires, including a first ground wire and a second ground wire, the first ground wire being formed on the first circuit block and connected to the first ground pad, the second ground wire being formed on the second circuit block and connected to the second ground pad.

2. A chip layout of an integrated circuit on a semiconductor substrate, comprising:

a plurality of circuit blocks, including first and second circuit blocks, provided on the semiconductor substrate;

a plurality of power supply pads, including first and second power supply pads;

a plurality of ground pads, including first and second ground pads;

a plurality of power supply wires, including a first power supply wire and a second power supply wire, the first power supply wire being formed on the first circuit block and connected to the first power supply pad, the second power supply wire being formed on the second circuit block and connected to the second power supply pad, wherein the second power supply wire is the only power supply wire formed on the second circuit; and a plurality of ground wires, including a first ground wire and a second ground wire, the first ground wire being formed on the first circuit block and connected to the first ground pad, the second ground wire being formed on the second circuit block and connected to the second ground pad.

3. A chip layout of an integrated circuit on a semiconductor substrate, comprising:

a plurality of circuit blocks, including first and second circuit blocks, provided on the semiconductor substrate;

a plurality of power supply pads, including first and second power supply pads;

a plurality of ground pads, including first and second ground pads;

a plurality of power supply wires, including a first power supply wire and a second power supply wire, the first power supply wire being formed on the first circuit block and connected to the first power supply pad, the second power supply wire being formed on the second circuit block and connected to the second power supply pad, wherein the plurality of power supply wires includes a third power supply wire connected to the second power supply wire, and the plurality of ground wires includes a third ground wire connected to the second ground wire, the third ground wire and the third power supply wire together having a ring-shape surrounding the second circuit block; and a plurality of ground wires, including a first ground wire and a second ground wire, the first ground wire being formed on the first circuit block and connected to the first ground pad, the second ground wire being formed on the second circuit block and connected to the second ground pad.

4. An integrated circuit on a semiconductor substrate, the circuit having a chip layout, wherein the layout includes:

a plurality of circuit blocks, including first and second circuit blocks, provided on the semiconductor substrate;

a plurality of power supply pads, including first and second power supply pads;

a plurality of ground pads, including first and second ground pads;

a plurality of power supply wires, including a first power supply wire and a second power supply wire, the first power supply wire being formed on the first circuit block and connected to the first power supply pad, the second power supply wire formed on the second circuit block and connected to the second power supply pad, wherein the second power supply wire of the layout is the only power supply wire formed on the second circuit block; and a plurality of ground wires, including a first ground wire and a second ground wire, the first ground supply wire being formed on the first circuit block and connected to the first ground pad, the second ground wire being formed on the second circuit block and connected to the second ground pad.

5. An integrated circuit according to claim 4, in combination with means for providing electrical power for the circuit blocks to each of the plurality of power supply pads.

6. An integrated circuit on a semiconductor substrate, the circuit having a chip layout, wherein the layout includes:

a plurality of circuit blocks, including first and second circuit blocks, provided on the semiconductor substrate;

a plurality of power supply pads, including first and second power supply pads;

a plurality of ground pads, including first and second ground pads;

a plurality of power supply wires, including a first power supply wire and a second power supply wire, the first power supply wire being formed on the first circuit block and connected to the first power supply pad, the second power supply wire formed on the second circuit block and connected to the second power supply pad, wherein the second power supply wire of the layout is not electrically connected to any other of the power supply wires of the layout.

7. An integrated circuit on a semiconductor substrate, the circuit having a chip layout, wherein the layout includes:

a plurality of circuit blocks, including first and second circuit blocks, provided on the semiconductor substrate;

a plurality of power supply pads, including first and second power supply pads;

a plurality of ground pads, including first and second ground pads;

a plurality of power supply wires, including a first power supply wire and a second power supply wire, the first power supply wire being formed on the first circuit block and connected to the first power supply pad, the second power supply wire formed on the second circuit block and connected to the second power supply pad, wherein the plurality of power supply wires includes a third power supply wire connected to the second power supply wire, and the plurality of ground wires includes a third ground wire connected to the second ground wire, the third ground wire and the third power supply wire together having a ring-shape surrounding the second circuit block.

8. An integrated circuit according to claim 7, in combination with means for providing electrical power for the circuit blocks to each of the plurality of power supply pads.

9. An integrated circuit according to claim 6, in combination with means for providing electrical power for the circuit blocks to each of the plurality of power supply pads.

* * * * *

UNITED STATES PATENT AND TRADEMARK OFFICE
CERTIFICATE OF CORRECTION

PATENT NO. : 5,952,684
DATED : September 14, 1999
INVENTOR(S) : Masahisa Tashiro It is certified that error appears in the above-identified patent and that said Letters Patent is hereby corrected as shown below:

Column 7,
Line 16, after "supply" change "wire," to -- wire; --; and change "the" to -- a --;
Line 16, beginning with "a plurality" insert new paragraph;
Line 17, after "wires" change "includes a" to -- including first, second, third and fourth ground wires, the --;
Line 20, change "block;" to -- block, --; and delete "and";
Lines 21 and 22, delete "a plurality of ground wires, including a first ground wire and a second ground wire".

Signed and Sealed this

Seventh Day of February, 2006

JON W. DUDAS
*Director of the United States Patent and Trademark Office*

UNITED STATES PATENT AND TRADEMARK OFFICE
CERTIFICATE OF CORRECTION

PATENT NO. : 5,952,684  Page 1 of 1
DATED : September 14, 1999
INVENTOR(S) : Masahisa Tashiro It is certified that error appears in the above-identified patent and that said Letters Patent is hereby corrected as shown below:

<u>Column 7,</u>
Line 17, after "wires" change "includes a" to -- including first, second, "and third" ground wires, the --.

Signed and Sealed this

Twenty-third Day of May, 2006

JON W. DUDAS
*Director of the United States Patent and Trademark Office*